(12) United States Patent
Liu et al.

(10) Patent No.: US 9,847,362 B2
(45) Date of Patent: Dec. 19, 2017

(54) SEMICONDUCTOR PHOTOSENSITIVE UNIT AND SEMICONDUCTOR PHOTOSENSITIVE UNIT ARRAY THEREOF

(71) Applicant: SU ZHOU ORIENTAL SEMICONDUCTOR CO., LTD., Jiangsu (CN)

(72) Inventors: Wei Liu, Jiangsu (CN); Lei Liu, Jiangsu (CN); Pengfei Wang, Jiangsu (CN)

(73) Assignee: SU ZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 15/126,580

(22) PCT Filed: Apr. 8, 2015

(86) PCT No.: PCT/CN2015/076030
§ 371 (c)(1),
(2) Date: Sep. 15, 2016

(87) PCT Pub. No.: WO2015/154657
PCT Pub. Date: Oct. 15, 2015

(65) Prior Publication Data
US 2017/0084648 A1 Mar. 23, 2017

(30) Foreign Application Priority Data
Apr. 9, 2014 (CN) .......................... 2014 1 0140574

(51) Int. Cl.
*H01L 27/146* (2006.01)
*H01L 31/103* (2006.01)
*H01L 31/109* (2006.01)

(52) U.S. Cl.
CPC .. *H01L 27/14614* (2013.01); *H01L 27/14603* (2013.01); *H01L 27/14616* (2013.01);
(Continued)

(58) Field of Classification Search
CPC ......... H01L 27/14614; H01L 27/14636; H01L 27/14643; H01L 31/103; H01L 31/109; H01L 27/14603
See application file for complete search history.

(56) References Cited

U.S. PATENT DOCUMENTS 7,091,531 B2  8/2006  Boemler
2002/0171102 A1*  11/2002  Shizukuishi ...... H01L 27/14818
257/315

FOREIGN PATENT DOCUMENTS

CN  1684261 A  10/2005
CN  101237531 A  8/2008
(Continued)

OTHER PUBLICATIONS

ISA/CN, International Search Report issued in PCT/CN2015/076030, dated Jul. 22, 2015, total 5 pages with English translation.

*Primary Examiner* — Fei Fei Yeung Lopez
(74) *Attorney, Agent, or Firm* — Masuvalley & Partners

(57) ABSTRACT

The present invention relates to a semiconductor photosensitive unit and a semiconductor photosensitive unit array thereof, including a floating gate transistor, a gating MOS transistor and a photodiode that are disposed on a semiconductor substrate. An anode or a cathode of the photodiode is connected to a floating gate of the floating gate transistor through the gating MOS transistor, and the corresponding cathode or anode of the photodiode is connected to a drain of the floating gate transistor or connected to an external electrode. After the gating MOS transistor is switched on, the floating gate is charged or discharged through the photodiode; and after the gating MOS transistor is switched (Continued)

off, charges are stored in the floating gate of the floating gate transistor. Advantages like a small unit area, low surface noise, long charge storage time of the floating gate, and large dynamic range of an operating voltage are achieved.

17 Claims, 7 Drawing Sheets

(52) U.S. Cl.
CPC .. *H01L 27/14636* (2013.01); *H01L 27/14643* (2013.01); *H01L 31/103* (2013.01); *H01L 31/109* (2013.01)

(56) References Cited

FOREIGN PATENT DOCUMENTS

| | | | |
|---|---|---|---|
| CN | 101707202 A | 5/2010 | |
| CN | 103594477 A | 2/2014 | |
| CN | 104157658 A | 11/2014 | |
| JP | 2003333431 A | 11/2003 | |

\* cited by examiner

SEMICONDUCTOR PHOTOSENSITIVE UNIT AND SEMICONDUCTOR PHOTOSENSITIVE UNIT ARRAY THEREOF

RELATED APPLICATIONS

This application is the U.S. National Phase application under 35 U.S.C. §371 of International Patent Application No. PCT/CN2015/076030, filed Apr. 8, 2015, entitled "SEMICONDUCTOR LIGHT SENSITIVE CELL AND SEMICONDUCTOR LIGHT SENSITIVE CELL ARRAY," which claims priority to Chinese Patent Application No. 201410140574.9, filed Apr. 9, 2014, which are hereby expressly incorporated by reference in their entirety for all purposes.

BACKGROUND OF THE INVENTION

Field of the Invention

The present invention relates to a CMOS image sensor, and more particularly to a semiconductor photosensitive unit and a semiconductor photosensitive unit array thereof.

Description of Related Art

The existing image sensors are mainly divided into two types: charge-coupled device image sensors and CMOS image sensors. The charge-coupled device image sensors have advantages such as high image quality and low noise, but have high production cost and are difficult to be integrated with a peripheral circuit. The CMOS image sensors have high integration level, small volume, low power consumption, and a wide dynamic range, are compatible with the manufacturing process of the charge-coupled device image sensors, and meet the condition of high system integration. Therefore, the CMOS image sensors have become a research focus in recent years.

FIG. 1 illustrates an existing CMOS image sensor composed of a circuit of a single pixel unit. A single pixel unit of the CMOS image sensor has four MOS transistors and specifically includes: a photodiode (PD), a charge overflow gate transistor (TG), a reset transistor (RST), a source follower (SF), and a selector transistor (RS); its working process is as follows: firstly, entering a "reset state", in which the reset transistor is switched on to reset the photodiode; then, entering a "sampling state", in which the reset transistor is switched off, and photon-generated carriers are produced when light is irradiated onto the photodiode and are amplified and output by means of the source follower; and finally, entering a "read state", in which the selector transistor is switched on and signals are output via a column bus. The defect of the CMOS image sensor is that, the four independently working MOS transistors occupy a large substrate area in the single pixel unit of the CMOS image sensor, the product pixel is low, and the product resolution is not high.

To overcome the defect of the existing CMOS image sensor, Chinese Patent No. 200910234800.9 discloses a "Planar-Channel Semiconductor Photosensitive Device", and its cross-sectional diagram along the length direction of a current channel is illustrated in FIG. 2. The function of a semiconductor photosensitive device 10 is enabled by charging or discharging a floating gate using a photosensitive pn junction diode disposed between a floating gate region 505 and a drain 514, thereby simplifying the structure of the semiconductor photosensitive device and also improving the resolution of the image sensor. However, to guarantee the performance of the semiconductor photosensitive device, the planar-channel semiconductor photosensitive device also requires a long current channel, which increases the area of the semiconductor photosensitive device to some extent and reduces the chip density. To overcome this defect, Chinese Patent Application No. 201310513086.3 discloses a U-shaped channel semiconductor photosensitive device, wherein on the basis that a photosensitive pn junction diode is used to charge or discharge a floating gate, a current channel region is recessed in a semiconductor substrate, which can reduce the size of the device while extending the current channel region. However, the above two structures of semiconductor photosensitive devices that charge or discharge a floating gate by using a photosensitive pn junction diode have a common problem: a photosensitive region of the photosensitive pn junction diode requires a large area, and the floating gate is directly connected to the photosensitive region of the photosensitive pn junction diode, so that after being charged into the floating gate, the photosensitive current is easily leaked to the photosensitive region of the photosensitive pn junction diode, which directly affects the working reliability of the image sensor device.

SUMMARY OF THE INVENTION

Technical Problem

An object of the present invention is to provide a semiconductor photosensitive unit and a semiconductor photosensitive unit array thereof to overcome the defects in the prior art, and the present invention can simplify the structure of an image sensor, improve the pixel of an image sensor chip, and meanwhile guarantee the working reliability of the image sensor.

Technical Solution

A semiconductor photosensitive unit provided according to the present invention includes, in a semiconductor substrate of a first conductivity type, a photodiode provided with a first end of the first conductivity type and a second end of a second conductivity type; and a floating gate transistor provided with a first source and a first drain of the second conductivity type, a floating gate of the first conductivity type that controls the switch-on or switch-off of a first current channel region between the first source and the first drain, and a first control gate having a capacitive coupling effect on the floating gate, wherein a gating MOS transistor is disposed between the photodiode and the floating gate transistor, the gating MOS transistor is provided with a second source and a second drain of the first conductivity type and a second control gate for controlling the switch-on or switch-off of a second current channel region between the second source and the second drain, the second drain of the gating MOS transistor is connected to the first end of the photodiode, and the second source of the gating MOS transistor is connected to the floating gate of the floating gate transistor.

Further preferred solutions of the present invention are as follows:

In the present invention, the photodiode is a homojunction diode or heterojunction diode.

In the present invention, the floating gate is at least partially recessed in the semiconductor substrate.

In the present invention, the floating gate is at least partially recessed in the semiconductor substrate, and the first control gate is at least partially recessed in the semiconductor substrate.

In the present invention, the second control gate is at least partially recessed in the semiconductor substrate.

In the present invention, the first conductivity type of the photodiode is p-type and the second conductivity type of the photodiode is n-type, and the second drain of the gating MOS transistor is connected to an anode of the photodiode.

In the present invention, the first conductivity type of the photodiode is n-type and the second conductivity type of the photodiode is p-type, and the second drain of the gating MOS transistor is connected to a cathode of the photodiode.

In the present invention, the first conductivity type of the photodiode is p-type and the second conductivity type of the photodiode is n-type, the second drain of the gating MOS transistor is connected to the anode of the photodiode, and the first drain of the floating gate transistor is connected to the cathode of the photodiode.

In the present invention, the first conductivity type of the photodiode is n-type and the second conductivity type of the photodiode is p-type, the second drain of the gating MOS transistor is connected to the cathode of the photodiode, and the first drain of the floating gate transistor is connected to the anode of the photodiode.

In the present invention, a doped well of the second conductivity type is disposed in the semiconductor substrate of the first conductivity type, the second current channel region is disposed in the doped well of the second conductivity type, a diffusion region and a photosensitive region of the first conductivity type that are connected to the second current channel region are respectively disposed in the doped well at two sides of the second current channel region, and a third-layer insulation film and the second control gate are sequentially disposed on the second current channel region.

In the present invention, a pinning layer of the second conductivity type is disposed in the photosensitive region of the first conductivity type.

In the present invention, the first current channel region is disposed in the semiconductor substrate of the first conductivity type; the first source and the first drain of the second conductivity type that are connected to the first current channel region are respectively formed in the semiconductor substrate at two sides of the first current channel region; a first insulation layer for isolating the first current channel region, the first drain and the first source from the doped well of the second conductivity type is disposed in the semiconductor substrate; and a first-layer insulation film, the floating gate of the first conductivity type, a second-layer insulation film, and the first control gate are sequentially disposed on the first current channel region.

In the present invention, the floating gate is electrically connected to the diffusion region of the first conductivity type, or the floating gate extends onto the diffusion region of the first conductivity type and contacts the same.

In the present invention, the first source of the second conductivity type is disposed in the semiconductor substrate of the first conductivity type; the first current channel region is disposed in the part of the semiconductor substrate between the first source and the doped well of the second conductivity type; and a first-layer insulation film, the floating gate of the first conductivity type, a second-layer insulation film, and the first control gate are sequentially disposed on the first current channel region, the floating gate extending out of the first-layer insulation film onto the diffusion region of the first conductivity type and contacting the same.

A semiconductor photosensitive unit array provided according to the present invention includes multiple semiconductor photosensitive units based on the present invention, and further includes multiple source lines, multiple word lines, multiple selection lines, multiple bit lines, and multiple read lines, wherein any one of the source lines is connected to first sources of the semiconductor photosensitive units, any one of the word lines is connected to first control gates of the semiconductor photosensitive units, any one of the selection lines is connected to second control gates of the semiconductor photosensitive units, any one of the bit lines is connected to second ends of photodiodes of the semiconductor photosensitive units, any one of the read lines is connected to first drains of the semiconductor photosensitive units, and a combination of any one of the word lines and any one of the read lines corresponds to an individual semiconductor photosensitive unit.

A semiconductor photosensitive unit array provided according to the present invention includes multiple semiconductor photosensitive units based on the present invention, and further includes multiple source lines, multiple word lines, multiple selection lines, and multiple bit lines, wherein any one of the source lines is connected to first sources of the semiconductor photosensitive units, any one of the word lines is connected to first control gates of the semiconductor photosensitive units, any one of the selection lines is connected to second control gates of the semiconductor photosensitive units, any one of the bit lines is connected to first drains of the semiconductor photosensitive units, and a combination of any one of the word lines and any one of the bit lines corresponds to an individual semiconductor photosensitive unit.

The working principle of the semiconductor photosensitive unit in the present invention is as follows: together referring to FIG. 3 and FIG. 4, when light is irradiated onto a photodiode 20, a second control gate 31 of a gating MOS transistor 30 controls a second current channel region to be switched on, and then a floating gate 42 of a floating gate transistor 40 is charged using a photoelectric current generated by the photodiode 20; when the second control gate 31 of the gating MOS transistor 30 controls the second current channel region to be switched off, charges may be stored in the floating gate 42 of the floating gate transistor 40 for a long time. Meanwhile, the quantity of the charges stored in the floating gate 42 may change a threshold voltage of the floating gate transistor 40, and when data is read, appropriate voltages are applied on a first control gate 41, a first source 43 and a first drain 44 of the floating gate transistor 40, and different test currents between the first source 43 and the first drain 44 may be obtained under different threshold voltage conditions of the floating gate transistor.

Advantageous Effect

The present invention has significant advantages as compared with the prior art in that:

1. during light sensing of the semiconductor photosensitive unit of the present invention, the gating MOS transistor is switched on, the floating gate of the floating gate transistor is charged using the photodiode, and when charges are stored in the floating gate of the floating gate transistor, the gating MOS transistor is switched off, such that the floating gate is prevented from leaking charges and the charge storage time of the floating gate is increased;

2. when the semiconductor photosensitive unit of the present invention reads data, because the gating MOS transistor is in a switch-off state, the influence to the floating gate by the voltages applied on the photodiode and the first control gate can be reduced, and a dynamic range of an operating voltage can be increased;

3. the semiconductor photosensitive unit of the present invention has a small unit area and low surface noise, and improves the working reliability of the semiconductor photosensitive unit array of the present invention.

DETAILED DESCRIPTION OF THE INVENTION

To clearly illustrate specific implementations of the present invention, the thickness of each layer and each region in the present invention are amplified in the accompanying drawings of the description, and the size of the figures does not reflect the actual size; the accompanying drawings are exemplary and do not limit the scope of the present invention. The embodiments provided in the description are not limited to the specific shapes of the regions shown in the accompanying drawings, but include shapes resulting from deviations in fabrication and curves obtained by etching that generally feature bending or roundness, and the like; however, these shapes are all represented by rectangles in the embodiments of the present invention. Meanwhile, in the following descriptions, the used term "substrate" may be understood as including a semiconductor chip in a fabrication process and may include other film layers manufactured on the semiconductor chip.

The specific implementations of the present invention are further illustrated in detail below in connection with the accompanying drawings and embodiments.

Figure 1:
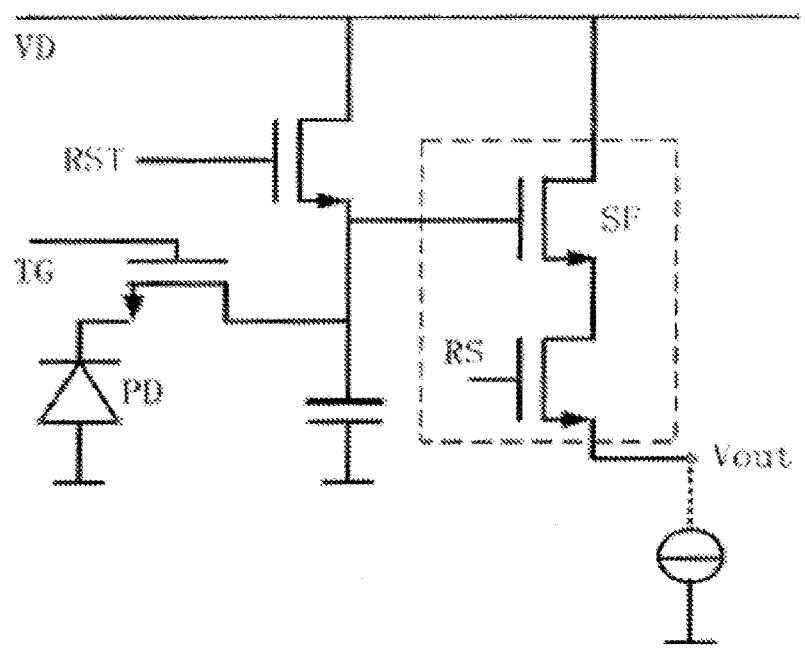
FIG. 1 and FIG. 2 are circuit diagrams of a single pixel unit of two types of existing CMOS image sensors.
Figure 2:
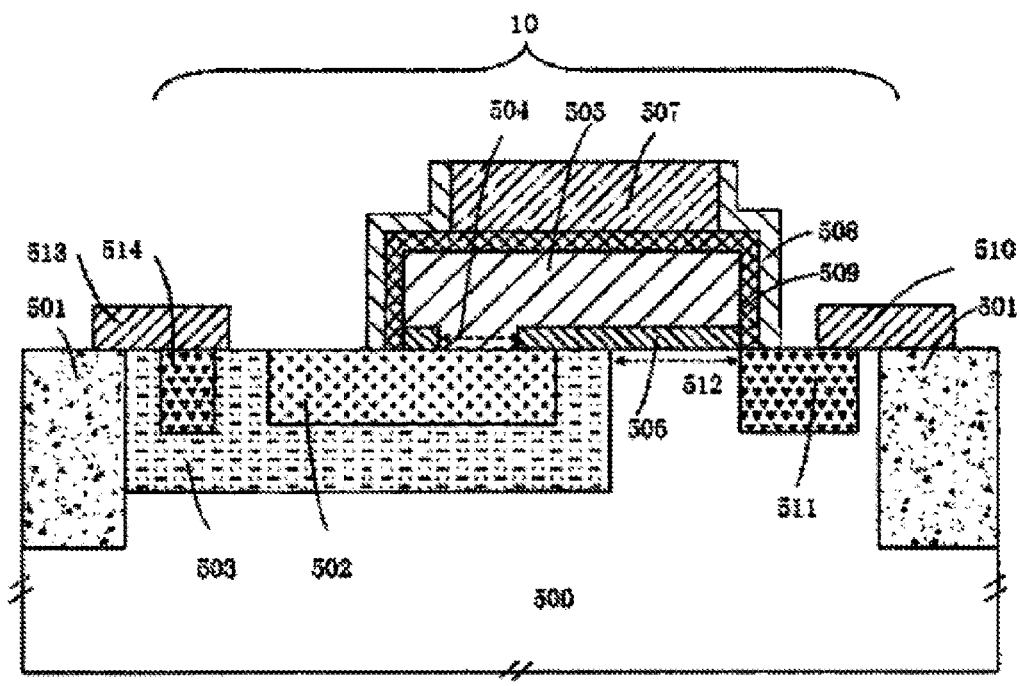
Figure 3:
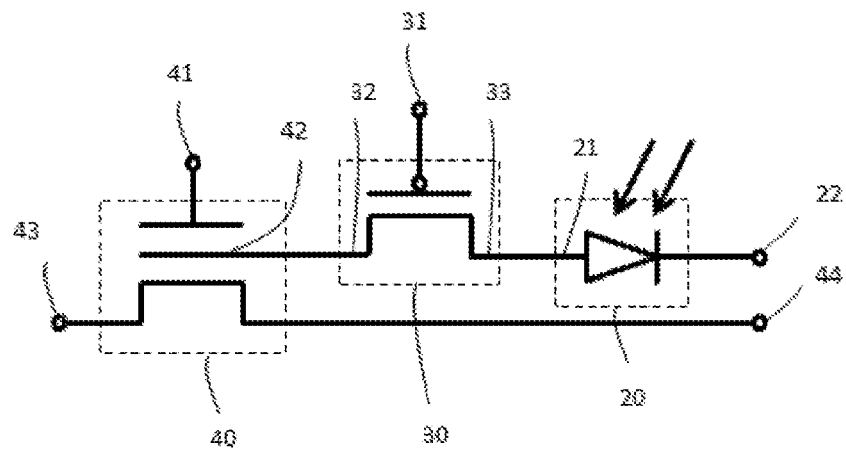
FIG. 3 and FIG. 4 are equivalent circuit diagrams of a semiconductor photosensitive unit in the present invention.
Figure 4:
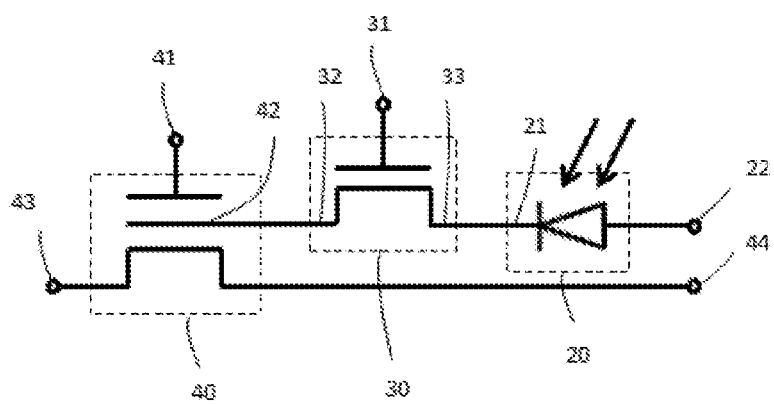

FIG. 3 and FIG. 4 are two equivalent circuit diagrams of a semiconductor photosensitive unit in the present invention. As shown in FIG. 3 and FIG. 4, the semiconductor photosensitive unit of the present invention includes a photodiode 20, a gating MOS transistor 30 and a floating gate transistor 40 that are disposed in a semiconductor substrate of a first conductivity type, wherein the photodiode 20 includes a first end 21 of the first conductivity type and a second end 22 of a second conductivity type; the floating gate transistor 40 includes a first source 43 and a first drain 44 of the second conductivity type, a floating gate 42 of the first conductivity type that controls the switch-on or switch-off of a first current channel region between the first source 43 and the first drain 44, and a first control gate 41 having a capacitive coupling effect on the floating gate 42; the gating MOS transistor 30 includes a second source 32 and a second drain 33 of the first conductivity type and a second control gate 31 for controlling the switch-on or switch-off of a second current channel region between the second source 32 and the second drain 33, the second source 32 of the gating MOS transistor 30 is connected to the floating gate 42 of the floating gate transistor 40, and the second drain 33 of the gating MOS transistor 30 is connected to the first end 21 of the first conductivity type of the photodiode 20.

The photodiode 20 of the semiconductor photosensitive unit in the present invention may be a silicon-based homojunction diode, and may also be a heterojunction diode using materials such as silicon germanium, gallium nitride or gallium arsenide with silicon; when the first conductivity type is p-type and the second conductivity type is n-type, the gating MOS transistor 30 is a PMOS transistor, the second source 32 of the gating MOS transistor 30 is connected to the floating gate 42 of the floating gate transistor 40, and the second drain 33 of the gating MOS transistor 30 is connected to an anode of the photodiode 20, as shown in FIG. 3; when the first conductivity type is n-type and the second conductivity type is p-type, the gating MOS transistor is an NMOS transistor, the second source 32 of the gating MOS transistor 30 is connected to the floating gate 42 of the floating gate transistor 40, and the second drain 33 of the gating MOS transistor 30 is connected to a cathode of the photodiode 20, as shown in FIG. 4.

Figure 5:
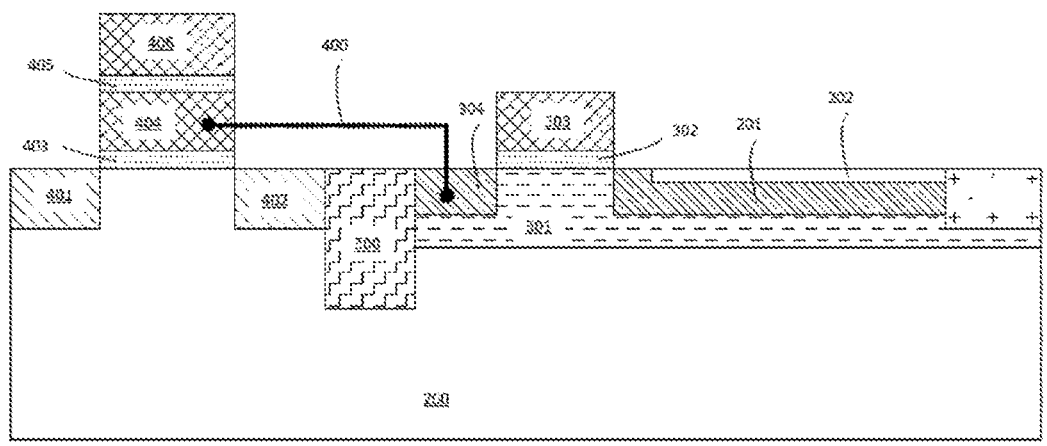
FIG. 5 to FIG. 7 are structural diagrams of three embodiments of the semiconductor photosensitive unit in the present invention.

FIG. 5 is a cross-sectional diagram of a first embodiment of the semiconductor photosensitive unit in the present invention as illustrated by the equivalent circuits in FIG. 3 and FIG. 4. As shown in FIG. 5, the semiconductor photosensitive unit of the present invention includes a doped well 301 of the second conductivity type formed in a semiconductor substrate 200 of the first conductivity type, and the semiconductor substrate 200 includes, but is not limited to, a silicon substrate, a germanium substrate, a silicon germanium substrate, or a silicon-on-insulator substrate; a diffusion region 304 and a photosensitive region 201 of the first conductivity type are disposed in the doped well 301 of the second conductivity type, a second current channel region is formed in the part of the semiconductor substrate between the diffusion region 304 and the photosensitive region 201 of the first conductivity type, and a third-layer insulation film 302 and a second control gate 303 are sequentially disposed on the second current channel region.

The photosensitive region 201 of the first conductivity type and the doped well 301 of the second conductivity type form a photodiode for light sensing, a pinning layer 202 of the second conductivity type is also disposed in the photosensitive region 201 of the first conductivity type, and the pinning layer 202 of the second conductivity type may be used for separating a light absorption region of the photodiode away from the disturbed surface of the semiconductor substrate 200; a doped region 202 of the second conductivity type with high doping concentration is also disposed in the doped well 301 of the second conductivity type, and the doped region 202 of the second conductivity type is used for leading out a non-photosensitive region end of the photodiode and the doped well 301 of the second conductivity type to be connected to an external electrode.

A first source 401 and a first drain 402 of the second conductivity type are further disposed in the semiconductor substrate 200 of the first conductivity type, a first current channel region is disposed in the part of the semiconductor substrate between the first source 401 and the first drain 402 of the second conductivity type, and the first current channel region, the first drain 402 and the first source 401 are isolated from the doped well 301 of the second conductivity type by a first insulation layer 300 in the semiconductor substrate 200; a first-layer insulation film 403, a floating gate 404 of the first conductivity type, a second-layer insulation film 405, and a first control gate 406 are sequentially disposed on the first current channel region; the floating gate 404 of the first conductivity type is electrically connected to the diffusion region 304 of the first conductivity type by an electrical connection line 400.

The first insulation layer 300 is a trench isolating structure having an insulating effect in the semiconductor substrate 200, and its material is silicon nitride or silicon dioxide.

The first conductivity type may be n-type or p-type; correspondingly, when the first conductivity type is n-type, the second conductivity type is p-type; and when the first conductivity type is p-type, the second conductivity type is n-type.

The materials of the first-layer insulation film 403, the second insulation film 405 and the third-layer insulation film 302 are respectively any of silicon dioxide, silicon nitride, silicon oxynitride, an insulating material of a high dielectric constant, or laminated layers of the above materials, wherein the insulating material of a high dielectric constant includes, but is not limited to, hafnium oxide, zirconium oxide or aluminum oxide.

The material of the floating gate 404 of the first conductivity type may be silicon, germanium or silicon germanium, may be tungsten, titanium or titanium nitride, and may also be a mixed layer of a semiconductor material and a metallic material.

The material of the first control gate 406 and the second control gate 303 may be a doped semiconductor material such as silicon, germanium or silicon germanium, may be a metallic material such as molybdenum, gold, titanium, tungsten, copper, or aluminum, and may also be a mixed layer of one or two types of metal compositions such as metal silicides or metal nitrides.

The material of the electrical connection line 400 is a wire composed of one or more of a metal such as molybdenum, gold, titanium, tungsten, copper, or aluminum, a metal composition such as a metal nitride or a metal silicide, and a doped semiconductor material such as doped silicon, germanium or silicon germanium.

Figure 6:
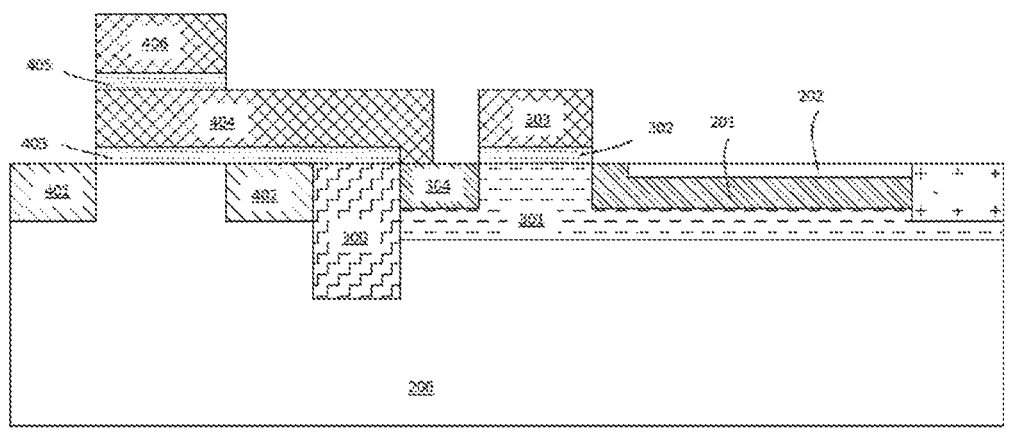

FIG. 6 is a cross-sectional diagram of a second embodiment of the semiconductor photosensitive unit in the present invention provided based on the two equivalent circuits of the semiconductor photosensitive unit in the present invention illustrated in FIG. 3 and FIG. 4. The semiconductor photosensitive unit illustrated in FIG. 6 is an improvement to the structure of the semiconductor photosensitive unit illustrated in FIG. 5. In the semiconductor photosensitive unit illustrated in FIG. 5, the floating gate 404 is electrically connected to the diffusion region 304 of the first conductivity type by the electrical connection line 400, while in the semiconductor photosensitive unit illustrated in FIG. 6, the floating gate 404 of the first conductivity type directly extends onto the diffusion region 304 of the first conductivity type and contacts the diffusion region 304 of the first conductivity type, such that the floating gate 404 of the first conductivity type is directly connected to the diffusion region 303 of the first conductivity type, whereby the manufacturing process of the semiconductor photosensitive unit can be simplified and the design difficulty of a peripheral circuit is reduced.

Figure 7:
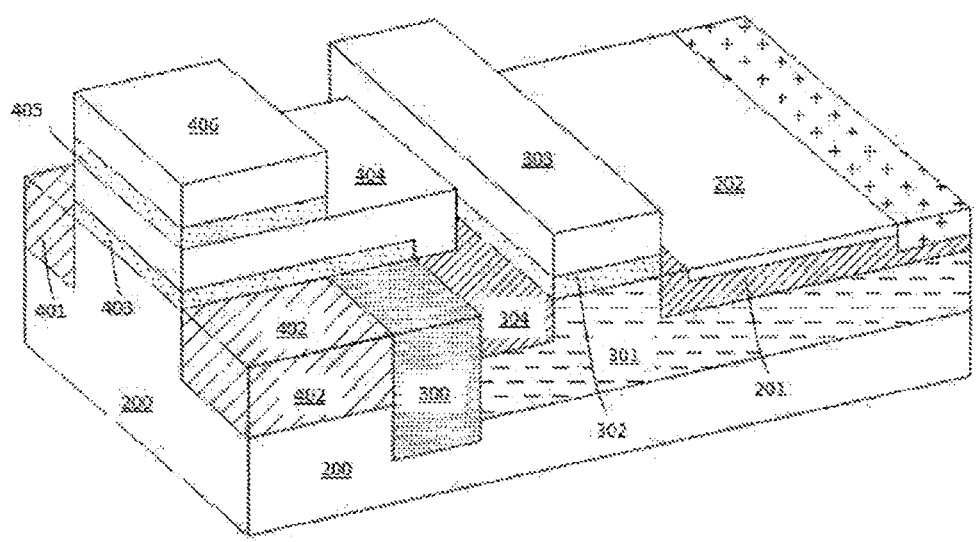

FIG. 7 is a three-dimensional structural diagram of a third embodiment of the semiconductor photosensitive unit in the present invention provided based on the two equivalent circuits of the semiconductor photosensitive unit in the present invention illustrated in FIG. 3 and FIG. 4. The semiconductor photosensitive unit illustrated in FIG. 7 is an improvement to the structure of the semiconductor photosensitive unit illustrated in FIG. 6. In the semiconductor photosensitive unit illustrated in FIG. 6, the first current channel region and the second current channel region are of a parallel structure; while in the semiconductor photosensitive unit illustrated in FIG. 7, the first current channel region and the second current channel region are of a vertical structure. Compared with the semiconductor photosensitive unit illustrated in FIG. 6, it is easier to control the manufacturing process of the semiconductor photosensitive unit illustrated in FIG. 7.

Figure 8:
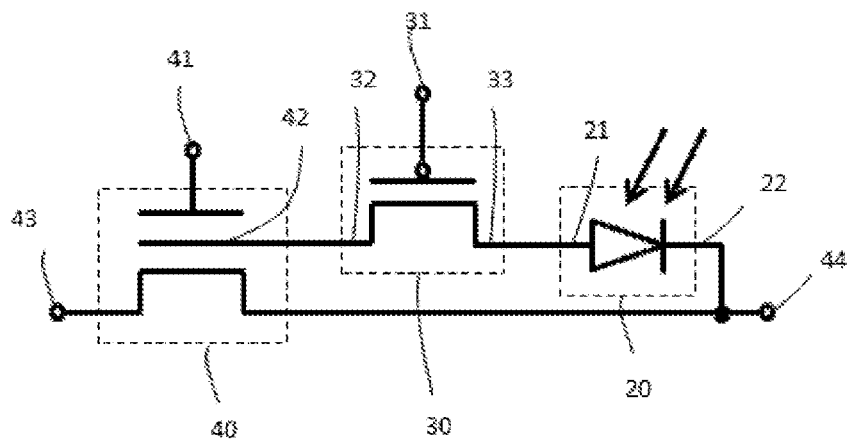
FIG. 8 and FIG. 9 are equivalent circuit diagrams of a semiconductor photosensitive unit in the present invention.
Figure 9:
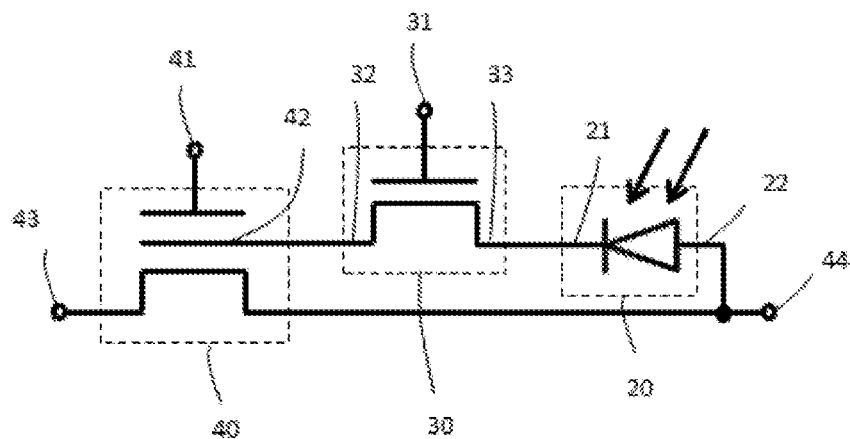

FIG. 8 and FIG. 9 are two equivalent circuit diagrams of the semiconductor photosensitive unit in the present invention. As shown in FIG. 8 and FIG. 9, the semiconductor photosensitive unit of the present invention includes the photodiode 20, the gating MOS transistor 30 and the floating gate transistor 40 that are disposed in the semiconductor substrate of the first conductivity type, wherein the photodiode 20 includes the first end 21 of the first conductivity type and the second end 22 of the second conductivity type; the floating gate transistor 40 includes the first source 43 and the first drain 44 of the second conductivity type, the floating gate 42 of the first conductivity type that controls the switch-on or switch-off of the first current channel region between the first source 43 and the first drain 44, and the first control gate 41 having a capacitive coupling effect on the floating gate 42; the gating MOS transistor 30 includes the second source 32 and the second drain 33 of the first conductivity type and the second control gate 31 for controlling the switch-on or switch-off of the second current channel region between the second source 32 and the second drain 33; the second source 32 of the gating MOS transistor 30 is connected to the floating gate 42 of the floating gate transistor 40, the second drain 33 of the gating MOS transistor 30 is connected to the first end 21 of the photodiode 20, and the second end of the photodiode 20 is connected to the first drain 44 of the floating gate transistor 40.

When the first conductivity type is p-type and the second conductivity type is n-type, the gating MOS transistor is a PMOS transistor, the second source 32 of the gating MOS transistor 30 is connected to the floating gate 42 of the floating gate transistor 40, the second drain 33 of the gating MOS transistor 30 is connected to the anode of the photodiode 20, and the cathode of the photodiode 20 is connected to the first drain 44 of the floating gate transistor 40, as shown in FIG. 8. When the first conductivity type is n-type and the second conductivity type is p-type, the gating MOS transistor is an NMOS transistor, the second source 32 of the gating MOS transistor 30 is connected to the floating gate 42 of the floating gate transistor 40, the second drain 33 of the gating MOS transistor 30 is connected to the cathode of the photodiode 20, and the anode of the photodiode 20 is connected to the first drain 44 of the floating gate transistor 40, as shown in FIG. 9.

The two equivalent circuits of the semiconductor photosensitive unit in the present invention illustrated in FIG. 8 and FIG. 9 may be regarded as further improvements to the two equivalent circuits of the semiconductor photosensitive unit in the present invention illustrated in FIG. 3 and FIG. 4. The direct connection of the second end 22 of the second conductivity type of the photodiode 20 to the first drain 44 of the first conductivity type of the floating gate transistor 40 can simplify the manufacturing process of the semiconductor photosensitive unit and reduce the design difficulty of a peripheral circuit.

Figure 10:
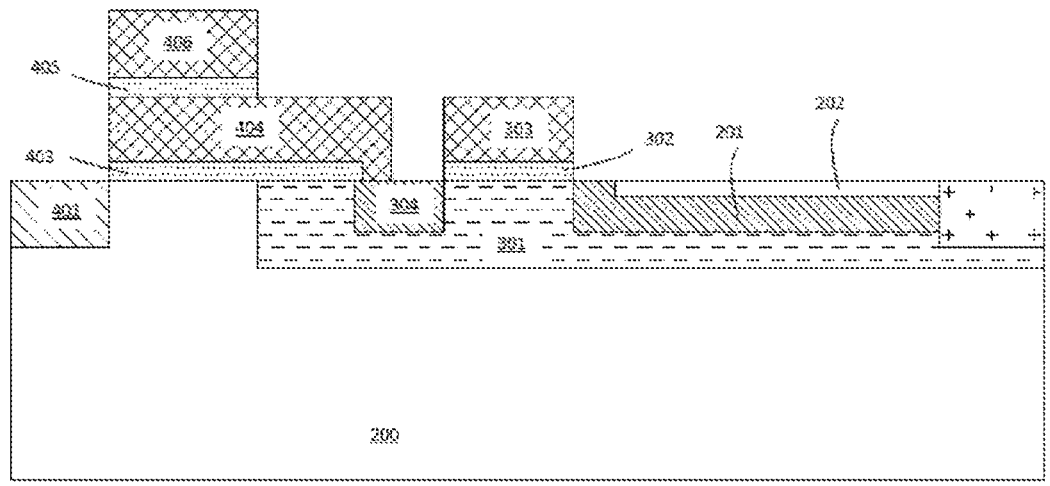
FIG. 10 to FIG. 15 are structural diagrams of six embodiments of the semiconductor photosensitive unit in the present invention.

FIG. 10 is a cross-sectional diagram of a fourth embodiment of the semiconductor photosensitive unit in the present invention provided based on the two equivalent circuits of the semiconductor photosensitive unit in the present invention illustrated in FIG. 8 and FIG. 9. As shown in FIG. 10, the semiconductor photosensitive unit of the present invention includes the doped well 301 of the second conductivity type disposed in the semiconductor substrate 200 of the first conductivity type, the diffusion region 304 and the photosensitive region 201 of the first conductivity type are disposed in the doped well 301 of the second conductivity type, the second current channel region is disposed in the part of the semiconductor substrate between the diffusion region 304 and the photosensitive region 201 of the first conductivity type, and the third-layer insulation film 302 and the second control gate 303 are sequentially disposed on the second current channel region. The photosensitive region 201 of the first conductivity type and the doped well 301 of the second conductivity type form a photodiode for light sensing, the pinning layer 202 of the second conductivity type is also disposed in the photosensitive region 201 of the first conductivity type, and the pinning layer 202 of the second conductivity type may be used for separating a light absorption region of the photodiode away from the disturbed surface of the semiconductor substrate 200. The doped region 202 of the second conductivity type with high doping concentration is also disposed in the doped well 301 of the first conductivity type, and the doped region 202 of the second conductivity type is used for leading out a non-photosensitive region end of the photodiode and the doped well 301 of the second conductivity type to be connected to an external electrode.

The first source 401 of the second conductivity type is further disposed in the semiconductor substrate 200 of the first conductivity type, the first current channel region is disposed in the part of the semiconductor substrate between the first source 401 of the second conductivity type and the doped well 301 of the second conductivity type, and the first-layer insulation film 403, the floating gate 404 of the first conductivity type, the second-layer insulation film 405, and the first control gate 406 are sequentially disposed on the first current channel region; the floating gate 404 of the first conductivity type extends out of the first-layer insulation film 403 onto the diffusion region 304 of the first conductivity type and contacts the diffusion region 303 of the first conductivity type, such that the floating gate 404 of the first conductivity type is connected to the diffusion region 304 of the first conductivity type.

The first conductivity type may be n-type or p-type; correspondingly, when the first conductivity type is n-type, the second conductivity type is p-type; and when the first conductivity type is p-type, the second conductivity type is n-type.

The materials of the first-layer insulation film 403, the second insulation film 405 and the third-layer insulation film 302 are respectively one of silicon dioxide, silicon nitride, silicon oxynitride, an insulating material of a high dielectric constant, or laminated layers of the above materials, wherein the insulating material of a high dielectric constant includes, but is not limited to, hafnium oxide, zirconium oxide or aluminum oxide.

The material of the floating gate 404 of the first conductivity type may be silicon, germanium or silicon germanium of the first conductivity type, may be tungsten, titanium or titanium nitride, and may also be a mixed layer of a semiconductor material and a metallic material.

The material of the first control gate 406 and the second control gate 303 may be a doped semiconductor material such as doped silicon, germanium or silicon germanium, may be a metallic material such as molybdenum, gold, titanium, tungsten, copper, or aluminum, and may also be a mixed layer of one or two types of metal compositions such as metal silicides and metal nitrides.

In the embodiments of the semiconductor photosensitive unit in the present invention illustrated in FIG. 5, FIG. 6, FIG. 7, and FIG. 10, the floating gate 404 of the first conductivity type, the first control gate 406 and the second control gate 303 are all disposed on the surface of the semiconductor substrate 200, such that the first current channel region controlled by the floating gate 404 of the first conductivity type and the second current channel region controlled by the second control gate 303 are both of a planar current channel structure. With the same size of the semiconductor photosensitive unit, in order to reduce the current leakage of the device and lower the power consumption by prolonging the length of the first current channel region and the second current channel region, the floating gate 404 of the first conductivity type, the first control gate 406 and the second control gate 303 in the semiconductor photosensitive unit of the present invention may additionally be separately or together recessed in the semiconductor substrate 200, thereby forming the first current channel region and the second current channel region of a recessed channel structure (also called a U-shaped channel structure) or a vertical channel structure.

Figure 11:
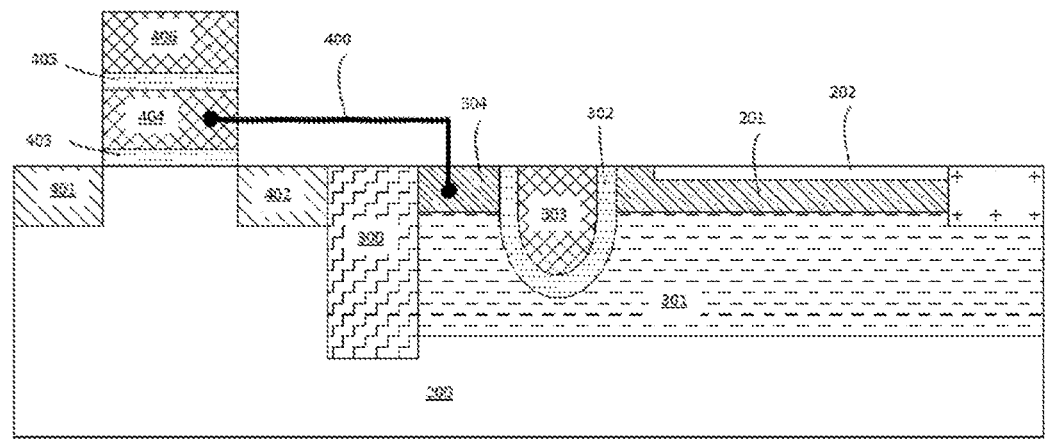

FIG. 11 is a cross-sectional diagram of a fifth embodiment of the semiconductor photosensitive unit in the present invention in which the second control gate 303 is recessed in the semiconductor substrate 200 and is applied in the semiconductor photosensitive unit illustrated in FIG. 5. As shown in FIG. 11, the second control gate 303 is recessed in the semiconductor substrate 200, thereby forming the second current channel region of a U-shaped channel structure, such that with the same size of the semiconductor photosensitive unit, the length of the second current channel region between the diffusion region 304 and the photosensitive region 201 of the first conductivity type is prolonged to reduce the current leakage, and with the same length of the second current channel region, the size of the semiconductor photosensitive unit is reduced and the density of an image sensor chip is increased.

Figure 12:
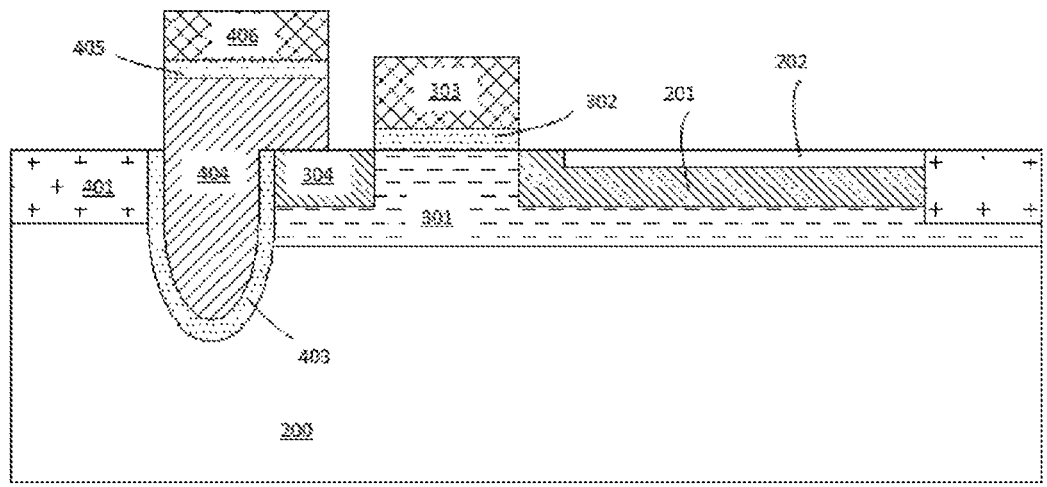

FIG. 12 is a cross-sectional diagram of a sixth embodiment of the semiconductor photosensitive unit in the present invention in which the floating gate 404 of the first conductivity type is recessed in the semiconductor substrate 200 and is applied in the semiconductor photosensitive unit illustrated in FIG. 10. As shown in FIG. 11, the floating gate 404 of the first conductivity type is recessed in the semiconductor substrate 200, thereby forming the first current channel region of a U-shaped channel structure, such that with the same size of the semiconductor photosensitive unit, the length of the first current channel region between the first source 401 and the doped well 201 of the second conductivity type is prolonged to reduce the current leakage and lower the power consumption of a chip. Meanwhile, with the same size of the semiconductor photosensitive unit, the depth of the doped well 301 of the second conductivity type may be increased to reduce the current leakage of a parasitic MOS transistor between the floating gate 404 of the first conductivity type and the semiconductor substrate 200 and prolong the charge storage time of the floating gate 404 of the first conductivity type; or with the same length of the first current channel region, the size of the semiconductor photosensitive unit is reduced and the density of an image sensor chip is increased.

Figure 13:
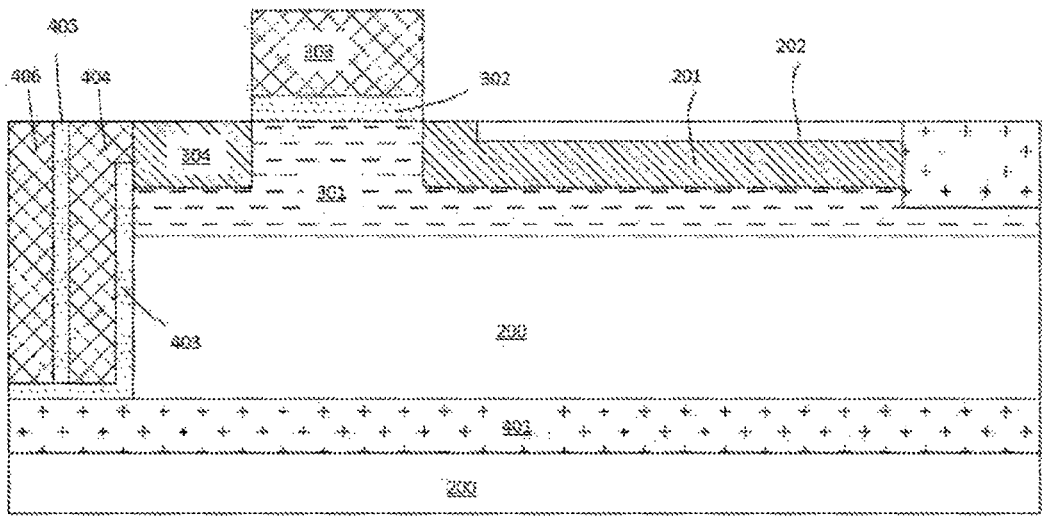

FIG. 13 is a cross-sectional diagram of a seventh embodiment of the semiconductor photosensitive unit in the present invention in which the first control gate 406 and the floating gate 404 of the first conductivity type are both recessed in the semiconductor substrate 200 and are applied in the semiconductor photosensitive unit illustrated in FIG. 10. As shown in FIG. 12, the first control gate 406 and the floating gate 404 of the first conductivity type are both recessed in the semiconductor substrate 200, and the first drain 401 of the second conductivity type is disposed in the semiconductor substrate 200 at the bottom of the floating gate 404 and the first control gate 406, thereby forming the current channel region of a vertical structure, such that with the same size of the semiconductor photosensitive unit, the length of the first current channel region between the first source 401 and the doped well 201 of the second conductivity type may be prolonged to reduce the current leakage and lower the power consumption of a chip, or with the same length of the first current channel region, the size of the semiconductor photosensitive unit is reduced and the density of an image sensor chip is increased.

Figure 14:
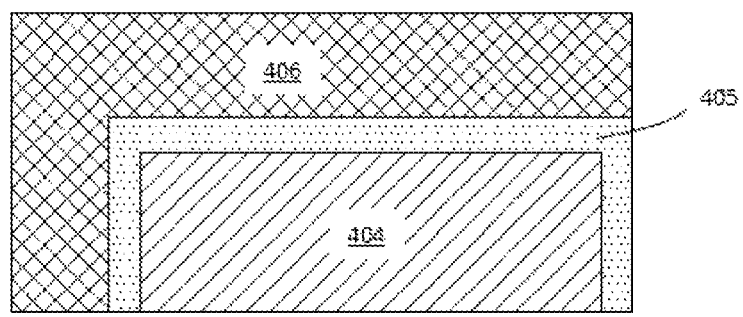

In the floating gate transistor of the semiconductor photosensitive unit in the present invention, the first control gate 406 of the floating gate transistor has a capacitive coupling effect on the floating gate 404 of the first conductivity type, and to increase the capacitive coupling ratio of the first control gate 406 to the floating gate 404 of the first conductivity type, the first control gate 406 is disposed on the floating gate 404 of the first conductivity type and extends to one side of the floating gate 404 of the first conductivity type, such that the first control gate 406 covers the floating gate 404 on the top and one side of the floating gate 404 of the first conductivity type, thereby increasing the corresponding area of the first control gate 406 and the floating gate 404 and increasing the capacitive coupling ratio of the first control gate 406 to the floating gate 404; FIG. 14 illustrates a structural diagram that the first control gate 406 covers the floating gate 404 on the top and one side of the floating gate 404.

Figure 15:
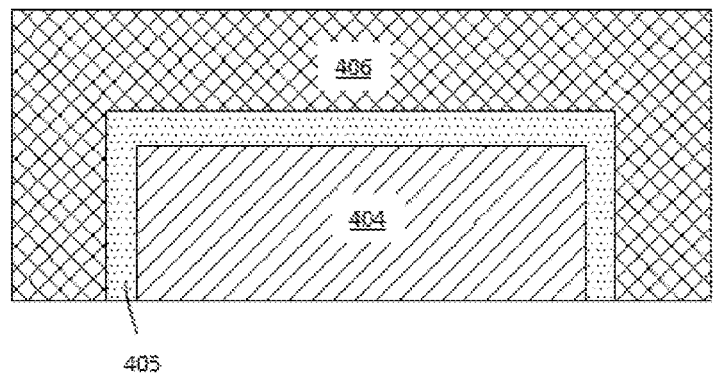

In the floating gate transistor, to increase the capacitive coupling ratio of the first control gate 406 to the floating gate 404 of the first conductivity type, the first control gate 406 may also be disposed on the floating gate 404 of the first conductivity type and extend to two sides of the floating gate 404 of the first conductivity type, such that the first control gate 406 covers the floating gate 404 on the top and two sides of the floating gate 404 of the first conductivity type, thereby further increasing the corresponding area of the first control gate 406 and the floating gate 404 and increasing the capacitive coupling ratio of the first control gate 406 to the floating gate 404; FIG. 15 illustrates a structural diagram that the first control gate 406 covers the floating gate 404 on the top and two sides of the floating gate 404.

Figure 16:
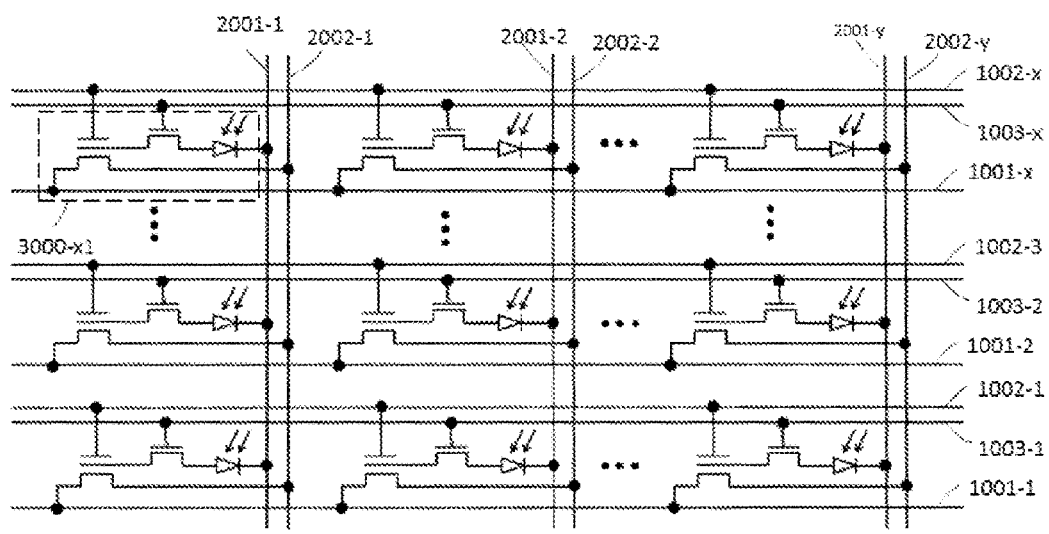
FIG. 16 to FIG. 17 are equivalent circuit diagrams of two embodiments of a semiconductor photosensitive unit array in the present invention.

A semiconductor photosensitive unit array of the present invention may be formed by using multiple semiconductor photosensitive units of the present invention. FIG. 16 is an equivalent circuit diagram of a first embodiment of the semiconductor photosensitive unit array in the present invention. As shown in FIG. 16, in this embodiment, the second end of the photodiode in each semiconductor photosensitive unit is not connected to the first drain of the floating gate transistor. The semiconductor photosensitive unit array of the present invention includes multiple source lines (1001-1, 1001-2, . . . , 1001-x), multiple word lines (1002-1, 1002-2, . . . , 1002-x), multiple selection lines (1003-1, 1003-2, . . . , 1003-x), multiple bit lines (2001-1, 2001-2, . . . , 2001-y), and multiple read lines (2002-1, 2002-2, . . . , 2002-y), wherein any one of the source lines is connected to the first sources of the semiconductor photosensitive units, any one of the word lines is connected to the first control gates of the semiconductor photosensitive units, any one of the selection lines is connected to the second control gates of the semiconductor photosensitive units, any one of the bit lines is connected to the second ends of the photodiodes of the semiconductor photosensitive units, any one of the read lines is connected to the first drains of the semiconductor photosensitive units, and a combination of any one of the word lines and any one of the read lines corresponds to an individual semiconductor photosensitive unit, for example, a combination of a word line 1002-x in the word lines and a read line 2002-1 in the read lines corresponds to an individual semiconductor photosensitive unit 3000-x1.

Figure 17:
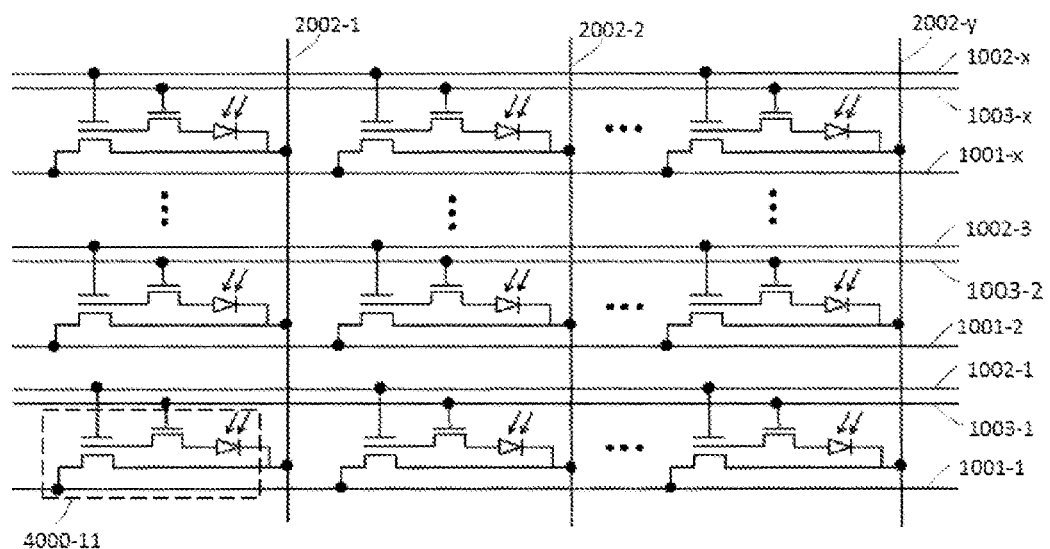

FIG. 17 is an equivalent circuit diagram of a second embodiment of the semiconductor photosensitive unit array in the present invention. As shown in FIG. 16, in this embodiment, the second end of the photodiode in each semiconductor photosensitive unit is connected to the first drain of the floating gate transistor. The semiconductor photosensitive unit array of the present invention includes multiple source lines (1001-1, 1001-2, . . . , 1001-x), multiple word lines (1002-1, 1002-2, . . . , 1002-x), multiple selection lines (1003-1, 1003-2, . . . , 1003-x), and multiple bit lines (2001-1, 2001-2, . . . , 2001-y), wherein any one of the source lines is connected to the first sources of the semiconductor photosensitive units, any one of the word lines is connected to the first control gates of the semiconductor photosensitive units, any one of the selection lines is connected to the second control gates of the semiconductor photosensitive units, any one of the bit lines is connected to the first drains of the semiconductor photosensitive units, and a combination of any one of the source lines and any one of the bit lines corresponds to an individual semiconductor photosensitive unit, for example, a combination of a word line 1002-1 in the word lines and a read line 2001-1 in the bit lines corresponds to an individual semiconductor photosensitive unit 4000-11.

Descriptions not mentioned in the specific implementations of the present invention belong to known technologies in the art, and may be implemented with reference to the known technologies.

The above specific implementations and embodiments are concrete support to the technical concept of the semiconductor photosensitive unit and the semiconductor photosensitive unit array thereof provided by the present invention, and are not intended to limit the protection scope of the present invention. Any equivalent changes or modifications made on the basis of the present technical solution following the technical concept provided by the present invention all fall within the protection scope of the technical solution of the present invention.

What is claimed is:

1. A semiconductor photosensitive unit, comprising, in a semiconductor substrate of a first conductivity type, a photodiode provided with a first end of the first conductivity type and a second end of a second conductivity type; and a floating gate transistor provided with a first source and a first drain of the second conductivity type, a floating gate of the first conductivity type that controls the switch-on or switch-off of a first current channel region between the first source and the first drain, and a first control gate having a capacitive coupling effect on the floating gate, wherein a gating MOS transistor is disposed between the photodiode and the floating gate transistor, the gating MOS transistor is provided with a second source and a second drain of the first conductivity type and a second control gate for controlling the switch-on or switch-off of a second current channel region between the second source and the second drain, the second drain of the gating MOS transistor is connected to the first end of the photodiode, and the second source of the gating MOS transistor is connected to the floating gate of the floating gate transistor.

2. The semiconductor photosensitive unit according to claim 1, wherein the photodiode is a homojunction diode or heterojunction diode.

3. The semiconductor photosensitive unit according to claim 1, wherein the floating gate is at least partially recessed in the semiconductor substrate.

4. The semiconductor photosensitive unit according to claim 1, wherein the floating gate is at least partially recessed in the semiconductor substrate, and the first control gate is at least partially recessed in the semiconductor substrate.

5. The semiconductor photosensitive unit according to claim 1, wherein the second control gate is at least partially recessed in the semiconductor substrate.

6. The semiconductor photosensitive unit according to claim 1, wherein the first conductivity type is p-type and the second conductivity type is n-type, and the second drain of the gating MOS transistor is connected to an anode of the photodiode.

7. The semiconductor photosensitive unit according to claim 1, wherein the first conductivity type is n-type and the second conductivity type is p-type, and the second drain of the gating MOS transistor is connected to a cathode of the photodiode.

8. The semiconductor photosensitive unit according to claim 1, wherein the first conductivity type is p-type and the second conductivity type is n-type, the second drain of the gating MOS transistor is connected to an anode of the photodiode, and the first drain of the floating gate transistor is connected to a cathode of the photodiode.

9. The semiconductor photosensitive unit according to claim 1, wherein the first conductivity type is n-type and the second conductivity type is p-type, the second drain of the gating MOS transistor is connected to a cathode of the photodiode, and the first drain of the floating gate transistor is connected to an anode of the photodiode.

10. The semiconductor photosensitive unit according to claim 1, wherein a doped well of the second conductivity type is disposed in the semiconductor substrate of the first conductivity type, the second current channel region is disposed in the doped well of the second conductivity type, a diffusion region and a photosensitive region of the first conductivity type that are connected to the second current channel region are respectively disposed in the doped well at two sides of the second current channel region, and a third-layer insulation film and the second control gate are sequentially disposed on the second current channel region.

11. The semiconductor photosensitive unit according to claim 10, wherein a pinning layer of the second conductivity type is disposed in the photosensitive region of the first conductivity type.

12. The semiconductor photosensitive unit according to claim 10, wherein the first current channel region is disposed in the semiconductor substrate of the first conductivity type; the first source and the first drain of the second conductivity type that are connected to the first current channel region are respectively formed in the semiconductor substrate at two sides of the first current channel region; a first insulation layer for isolating the first current channel region, the first drain and the first source of the second conductivity type is disposed in the semiconductor substrate; and a first-layer insulation film, the floating gate of the first conductivity type, a second-layer insulation film, and the first control gate are sequentially disposed on the first current channel region.

13. The semiconductor photosensitive unit according to claim 1, wherein the floating gate is electrically connected to the diffusion region of the first conductivity type, or the floating gate extends onto the diffusion region of the first conductivity type and contacts the same.

14. The semiconductor photosensitive unit according to claim 10, wherein the first source of the second conductivity type is disposed in the semiconductor substrate of the first conductivity type; the first current channel region is disposed in the part of the semiconductor substrate between the first source and the doped well of the second conductivity type; and a first-layer insulation film, the floating gate of the first conductivity type, a second-layer insulation film, and the first control gate are sequentially disposed on the first current channel region, the floating gate extending out of the first-layer insulation film onto the diffusion region of the first conductivity type and contacting the same.

15. A semiconductor photosensitive unit array, comprising multiple semiconductor photosensitive units according to claim 1, and further comprising multiple source lines, multiple word lines, multiple selection lines, multiple bit lines and multiple read lines, wherein any one of the source lines is connected to first sources of the semiconductor photosensitive units, any one of the word lines is connected to first control gates of the semiconductor photosensitive units, any one of the selection lines is connected to second control gates of the semiconductor photosensitive units, any one of the bit lines is connected to second ends of photodiodes of the semiconductor photosensitive units, any one of the read lines is connected to first drains of the semiconductor photosensitive units, and a combination of any one of the word lines and any one of the read lines corresponds to an individual semiconductor photosensitive unit.

16. A semiconductor photosensitive unit array, comprising multiple semiconductor photosensitive units according to claim 1, and further comprising multiple source lines, multiple word lines, multiple selection lines, and multiple bit lines, wherein any one of the source lines is connected to first sources of the semiconductor photosensitive units, any one of the word lines is connected to first control gates of the semiconductor photosensitive units, any one of the selection lines is connected to second control gates of the semiconductor photosensitive units, any one of the bit lines is connected to first drains of the semiconductor photosensitive units, and a combination of any one of the word lines and any one of the bit lines corresponds to an individual semiconductor photosensitive unit.

17. The semiconductor photosensitive unit according to claim 10, wherein the floating gate is electrically connected to the diffusion region of the first conductivity type, or the floating gate extends onto the diffusion region of the first conductivity type and contacts the same.

* * * * *